US010327322B2

(12) United States Patent
Habu

(10) Patent No.: US 10,327,322 B2
(45) Date of Patent: Jun. 18, 2019

(54) RADIO-FREQUENCY POWER UNIT

(71) Applicant: SHIMADZU CORPORATION, Kyoto-shi, Kyoto (JP)

(72) Inventor: Toshiya Habu, Kyoto (JP)

(73) Assignee: SHIMADZU CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 14/635,152

(22) Filed: Mar. 2, 2015

(65) Prior Publication Data
US 2015/0250046 A1 Sep. 3, 2015

(30) Foreign Application Priority Data
Mar. 3, 2014 (JP) .................. 2014-040543

(51) Int. Cl.
H03H 7/38 (2006.01)
H03H 7/40 (2006.01)
(Continued)

(52) U.S. Cl.
CPC ............. *H05H 1/46* (2013.01); *H01J 37/321* (2013.01); *H01J 37/32183* (2013.01);
(Continued)

(58) Field of Classification Search
CPC .......... H01L 21/3065; H01L 21/67069; H01L 21/67253; H01L 22/20; H01J 37/32;
(Continued)

(56) References Cited

U.S. PATENT DOCUMENTS 5,815,047 A * 9/1998 Sorensen ................ H03H 7/40
315/111.21
6,424,232 B1 * 7/2002 Mavretic ........... H01J 37/32082
333/17.3
(Continued)

FOREIGN PATENT DOCUMENTS

CN 101454863 A 6/2009
JP 2003-516691 A 5/2003
(Continued)

*Primary Examiner* — Alexander H Taningco
*Assistant Examiner* — Renan Luque
(74) *Attorney, Agent, or Firm* — Sughrue Mion, PLLC

(57) ABSTRACT

PROBLEM: To improve the stability of the process of the plasma ignition, by allowing a high current to pass through an induction coil without increasing the power-supply voltage in the process of the plasma ignition.
SOLUTION: An impedance conversion circuit 16 including an inductor 17 and a capacitor 18 is arranged between a full-bridge drive circuit 13 for switching DC voltage and an LC resonance circuit 19 including an induction coil 21 for plasma generation. The capacitance of the capacitor 18 can be varied between two levels, with a switching driver 23 serving as a switcher. When the plasma is to be ignited, the capacitance of the capacitor 18 is set at the higher level to allow a high current to be supplied to the LC resonance circuit 19. After the plasma is brought into a steady state of lighting, the capacitance of the capacitor 18 is changed to the lower level at which an impedance matching is achieved so as to maximize the power efficiency.

4 Claims, 3 Drawing Sheets

(51) Int. Cl.
*H05H 1/46* (2006.01)
*H01J 37/32* (2006.01)

(52) U.S. Cl.
CPC .......... *H01J 37/32091* (2013.01); *H03H 7/38* (2013.01); *H03H 7/40* (2013.01); *H05H 2001/4645* (2013.01); *H05H 2001/4682* (2013.01)

(58) Field of Classification Search
CPC ........... H01J 37/32082; H01J 37/32183; H01J 37/32935; H03H 7/40; H03H 7/38; H02M 7/219; H05H 1/46; H05H 2001/4645; H01P 1/15; H03F 2200/534; H03F 2200/541; H03F 3/265; H03J 5/244; H03K 17/74; H03K 2217/0054; H04B 1/48
USPC .............. 315/111.21; 333/32, 17.3; 363/271; 327/109, 574
See application file for complete search history.

(56) References Cited

U.S. PATENT DOCUMENTS

| | | | | |
|---|---|---|---|---|
| 2003/0042977 | A1* | 3/2003 | Kanda | H03F 3/265 330/10 |
| 2007/0139122 | A1* | 6/2007 | Nagarkatti | H03F 1/56 330/302 |
| 2008/0003702 | A1* | 1/2008 | Cruse | H01L 21/67069 438/7 |
| 2009/0129131 | A1* | 5/2009 | Hosemans | H05H 1/30 363/89 |
| 2010/0219757 | A1* | 9/2010 | Benzerrouk | H01J 37/321 315/111.51 |
| 2010/0253445 | A1* | 10/2010 | Ando | H01P 1/15 333/101 |
| 2012/0168081 | A1* | 7/2012 | Son | H01G 5/16 156/345.28 |
| 2013/0193867 | A1* | 8/2013 | Van Zyl | H01J 37/32183 315/240 |
| 2015/0179407 | A1* | 6/2015 | Koshimizu | H01J 37/32183 156/345.44 |
| 2016/0380610 | A1* | 12/2016 | Ulrich | H03H 7/38 333/32 |

FOREIGN PATENT DOCUMENTS

| | | |
|---|---|---|
| JP | 2008-202990 A | 9/2008 |
| JP | 2009-537829 A | 10/2009 |
| JP | 2010-225308 A | 10/2010 |
| WO | 01/43282 A1 | 6/2001 |
| WO | 2007/134363 A1 | 11/2007 |

* cited by examiner

RADIO-FREQUENCY POWER UNIT

TECHNICAL FIELD

The present invention relates to a radio-frequency power unit. More specifically, it relates to a radio-frequency power unit for supplying radio-frequency power to an induction coil to generate and maintain plasma in an analyzing system or manufacturing and processing system using plasma, such as an inductively coupled plasma (ICP) emission spectrometer or plasma chemical vapor deposition (CVD) system.

BACKGROUND ART

In an inductively coupled plasma (ICP) emission spectrometer, a plasma-generating gas (e.g. argon gas) is ionized by an electromagnetic field created by supplying radio-frequency power to an induction coil. While the obtained plasma is maintained by the electromagnetic field, a sample atom is introduced into the plasma. The sample atom is excited by the plasma, and when the excited atom returns to a lower energy level, it emits light whose wavelength is specific to the atom. By performing a spectrometry of the emitted light, a qualitative and quantitative determination of the sample is performed.

In an ICP emission spectrometer, in order to supply radio-frequency power to the plasma, a configuration is widely used in which an LC resonation circuit formed by an induction coil and a capacitor is driven by a radio-frequency power unit which can supply, for example, radio-frequency power of several hundred watts to several kilowatts at a frequency of 27 MHz. In such a configuration, to enable the radio-frequency power unit to efficiently operate, the load impedance seen from the radio-frequency power unit should preferably be constant, and furthermore, the impedance should be matched with the optimum load impedance of the power unit.

However, when plasma is generated by passing a radio-frequency current through the induction coil, the impedance of the induction coil changes due to the effect of the induction current caused by the movement of charged particles in the plasma. The impedance of the induction coil also changes with a change in the state of the plasma, which occurs depending on the state of the plasma-generating gas or that of the sample to be analyzed, the amount of power supplied to the plasma, and other factors. Such a change in the impedance of the induction coil leads to a change in the load impedance seen from the radio-frequency power unit, causing the impedance matching to deviate from the optimum state.

To overcome this problem, a self-oscillating circuit has been commonly used in this type of radio-frequency power unit, in which the LC resonance circuit which includes the induction coil is driven by a switching circuit (such as a half-bridge or full-bridge circuit including a semiconductor switching element consisting of a MOSFET or the like), with the positive feedback of a signal from the LC resonation circuit to a control terminal (which is the gate terminal in the case of a MOSFET) of the semiconductor switching element via a transformer or similar component.

FIG. 5 is a schematic configuration diagram of a radio-frequency power unit using a self-oscillation, which is described in Patent Literature 1. In this circuit, four MOSFETs 141, 142, 143 and 144 form a full-bridge circuit. Electric power is supplied from this full-bridge circuit to an LC resonance circuit 31 including an induction coil 32 and a capacitor 33 via inductors 301, 302, 303 and 304. The thereby generated flow of current in the LC resonance circuit 31 pass through the primary winding 34 of a transformer (inductive coupler) and fed back through a feedback path (not shown) to the gate electrode of each of the MOSFETs 141-144. In such a self-oscillating circuit, when the impedance of the induction coil 32 changes depending on a change in the state of the plasma, the resonant frequency of the LC resonance circuit 31 automatically changes. This produces an advantageous result whereby the load impedance seen from the full-bridge circuit is constantly maintained at optimum levels, allowing the oscillation to continue with high efficiency without requiring any special control or command from outside sources.

CITATION LIST

Patent Literature

Patent Literature 1: JP 2009-537829A

SUMMARY OF INVENTION

Technical Problem

ICP emission spectrometer require a considerable amount of radio-frequency current to be supplied to the induction coil in order to produce plasma under atmospheric pressure; in particular, a greater amount of current is required in the process of the plasma ignition than during the steady state of lighting. The degree of ease or difficulty of the plasma ignition, is affected by the flow rate of the plasma-generating gas, purity of this gas, shape of the plasma torch, atmosphere in which the plasma stand is placed, and other factors. To maintain a stable and easy plasma ignition, it is necessary to allow for the fluctuations or variations of the various aforementioned factors and supply a sufficient amount of radio-frequency current to the induction coil. To increase the current supplied to the induction coil 32 in the conventional circuit shown in FIG. 5, the power-supply voltage +Vcc needs to be increased.

The power-supply voltage +Vcc is restricted by the rated voltage of the semiconductor switching element (in the example of FIG. 5, MOSFETs 141-144) used in the full-bridge circuit. Therefore, in order to ensure a stable plasma ignition by increasing the power-supply voltage +Vcc, it is necessary to use semiconductor switching elements having a rated voltage which is high enough to withstand the increase in the power-supply voltage +Vcc. However, a semiconductor switching element with a high level of rated voltage has a high on-resistance, which may lead to an increase in the loss of power in the radio-frequency power unit.

The present invention has been developed in view of such a problem. Its objective is to provide a radio-frequency power unit capable of maintaining the stability of the plasma ignition, while suppressing the rated voltage of the semiconductor switching elements used in the switching circuit (such as a full-bridge or half-bridge circuit), i.e. while using semiconductor switching elements having a low level of on-resistance.

Solution to Problem

The present invention aimed at solving the aforementioned problem is a radio-frequency power unit comprising: a DC voltage source; an LC resonance circuit including an induction coil for plasma generation and a capacitor; and a switching circuit including a semiconductor switching element for switching DC power supplied from the DC voltage source and for supplying the thereby obtained power to the LC resonance circuit, thus supplying radio-frequency power into the induction coil so as to generate plasma, the radio-frequency power unit further including:

a) an impedance converter arranged between the switching circuit and the LC resonance circuit, the impedance converter being capable of switching an impedance conversion factor among a plurality of levels; and b) a controller for operating the impedance converter so as to switch the impedance conversion factor from a value used during a period of plasma ignition to a value used during a period with a steady state of lighting after the plasma is ignited.

The radio-frequency power unit according to the present invention is particularly suitable as a radio-frequency power unit for generating plasma in an ICP emission spectrometer.

In the radio-frequency power unit according to the present invention, for example, the switching circuit may be a half-bridge or full-bridge circuit using a plurality of semiconductor switching elements. Typically, a power MOSFET can be used as the semiconductor switching element.

In the radio-frequency power unit according to the present invention, the impedance converter may have a configuration including reactance elements having mutually different polarities. Typically, the impedance converter may include an inductor and a capacitor and allows the impedance conversion factor to be switched by varying the capacitance of this capacitor.

The plurality of levels of the impedance conversion factor are determined by a constant of a circuit element included in the impedance converter, and one of those levels is previously adjusted so that the power supplied from the switching circuit will be most efficiently injected into the plasma when the plasma is in a steady state of lighting, i.e. so that the power efficiency in the steady state of lighting will be maximized. Normally, this is the optimum state of the impedance matching. In the radio-frequency power unit according to the present invention, the controller sets the constants of the circuit elements in the impedance converter so that the aforementioned impedance factor will be at the optimum level while the plasma is in the steady state of lighting. Accordingly, while the plasma is in the steady state of lighting, the plasma can be efficiently maintained with a low loss of power.

On the other hand, when the plasma needs to be ignited from the state where the plasma is not lighted, the controller sets the constants of the circuit elements in the impedance converter so that the aforementioned impedance factor will be set at a level where a greater amount of current can be supplied to the LC resonance circuit. The impedance conversion factor (i.e. the circuit constant) used in this case can also be previously determined by experiments or the like. Thus, the radio-frequency power unit according to the present invention is capable of passing a high radio-frequency current through the induction coil in the resonance circuit in the process of igniting the plasma, without increasing the power-supply voltage for the switching circuit or other components. Therefore, for example, in an ICP emission spectrometer, a high-energy alternating electromagnetic field is generated in the plasma torch, whereby a strong induction electric field is formed in the plasma-gas atmosphere. Consequently, an ionization of the plasma gas easily occurs and the plasma is ignited in a stable way.

However, after the plasma is ignited, if the impedance conversion factor of the impedance converter is suddenly switched, the plasma may be extinguished; specifically, this can occur if the impedance conversion factor is changed in a stepwise process. Accordingly, in a preferable mode of the radio-frequency power unit according to the present invention, the impedance converter includes a plurality of capacitors forming a parallel connection, a switching element for disconnecting a subset of these capacitors from the parallel connection, and an integration circuit for slowing down the change of a signal used for controlling the switching operation of the switching element. For example, a low-pass filter (e.g. an RC circuit) can be used as the integration circuit.

According to this configuration, when the impedance conversion factor in the impedance converter is switched after the plasma lighting is ignited, the capacitance of the capacitor does not change suddenly but to some extent slowly. This leads to a slower change in the current supplied to the induction coil and thereby prevents the plasma from being extinguished by the change of the current.

Advantageous Effects of the Invention

The radio-frequency power unit according to the present invention can pass a high radio-frequency current through an induction coil included in an LC resonance circuit and generate plasma in a stable way in the process of igniting the plasma, without increasing the power-supply voltage for the switching circuit which supplies power to the LC resonance circuit. While the plasma is in the steady state of lighting, the efficiency of power conversion can be maintained at the highest or nearly highest level.

DESCRIPTION OF EMBODIMENTS

Figure 1:
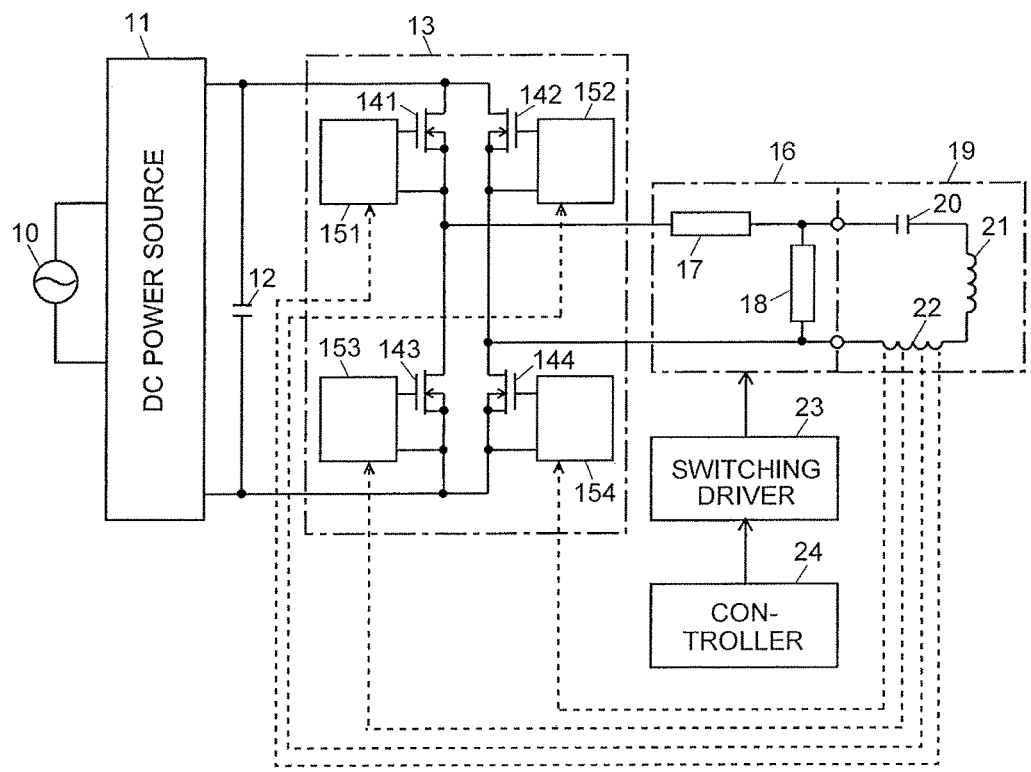
FIG. 1 is a schematic configuration diagram of a radio-frequency power unit as one embodiment of the present invention.

As one embodiment of the present invention, a radio-frequency power unit to be used for generating plasma in an ICP emission spectrometer is hereinafter described with reference to the attached drawings. FIG. 1 is a schematic configuration diagram of the radio-frequency power unit of the present embodiment.

An induction coil 21 which is wound around a plasma torch (not shown) in an ICP emission spectrometer so as to generate plasma in the plasma torch is the target to which the radio-frequency current needs to be supplied in the present radio-frequency power unit. A capacitor 20 and a primary winding 22 of a feedback transformer (for simplicity, only one winding is shown in FIG. 1, although there are actually four primary windings) are connected in series with the induction coil 21, whereby an LC resonance circuit 19 is formed. Since the inductance of the induction coil 21 as compared to the inductance by the primary winding 22 of the feedback transformer is sufficiently high, the inductance of the induction coil 21 is dominant among the inductances which determine the resonant frequency of the LC resonance circuit 19.

The DC power source 11 includes a rectifier circuit (e.g. a diode bridge circuit) and provides a predetermined amount of DC voltage based on the AC power supplied from an external commercial AC power source 10. A full-bridge drive circuit 13 is connected to the output terminal of the DC power source 11 via a parallel-connected capacitor 12. The full-bridge drive circuit 13 has two parallel-connected series circuits, one consisting of two MOSFETs 141 and 143 and the other consisting of two MOSFETs 142 and 144. MOSFET drive circuits 151-154 including secondary windings (not shown) magnetically coupled with the primary winding 22 of the feedback transformer are connected between the gate terminal and the source terminal of each of the four MOSFETs 141-144, respectively.

The full-bridge drive circuit 13 and the LC resonance circuit 19 are connected with each other via an impedance conversion circuit 16 including first and second reactance elements 17 and 18 having different polarities, whereby a loop is formed in which a current is passed from the full-bridge drive circuit 13 through the first and second reactance elements 17 and 18 when either the MOSFETs 141 and 144 or the MOSFETs 142 and 143 in the full-bridge drive circuit 13 are turned on.

Figure 3:
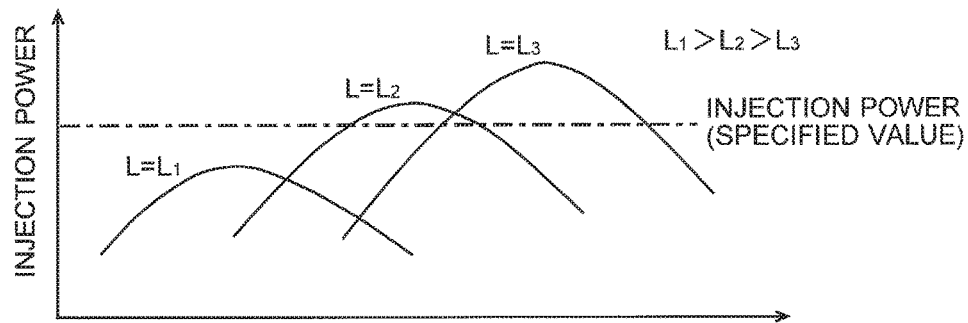
FIG. 3 is a diagram showing the relationship between the circuit constant in the impedance conversion circuit and the plasma injection power.

In the radio-frequency power unit of the present embodiment, the first reactance element 17 is an inductor, while the second reactance element 18 is a capacitor. Therefore, these two elements are hereinafter called the inductor 17 and capacitor 18. In the case where the power-supply voltage applied from the DC power source 11 to the full-bridge drive circuit 13 (i.e. the power-supply voltage of the full-bridge drive circuit 13) is fixed, the relationship between the inductance L of the inductor 17, the capacitance C of the capacitor 18 and the plasma injection power will be as shown in FIG. 3.

The optimum value of the voltage applied from the DC power source 11 to the full-bridge drive circuit 13 depends on the rated characteristics of the MOSFETs 141-144. Therefore, the output voltage of the DC power source 11 is previously determined taking into account their rated characteristics. Under this condition, the value of the inductance L of the inductor 17 is set so that the maximum value of the plasma injection power observed when the capacitance C of the capacitor 18 is varied over a predetermined range will satisfy a required value (specified value). Normally, it is undesirable to unnecessarily increase the amount of plasma injection power when the power-supply voltage is properly set. Accordingly, the inductance should preferably be determined so that the maximum value of the plasma injection power will be slightly higher than the specified value when the power-supply voltage is at a proper level. Therefore, for example, L2 is selected as the inductance L in the case of FIG. 3.

Figure 4:
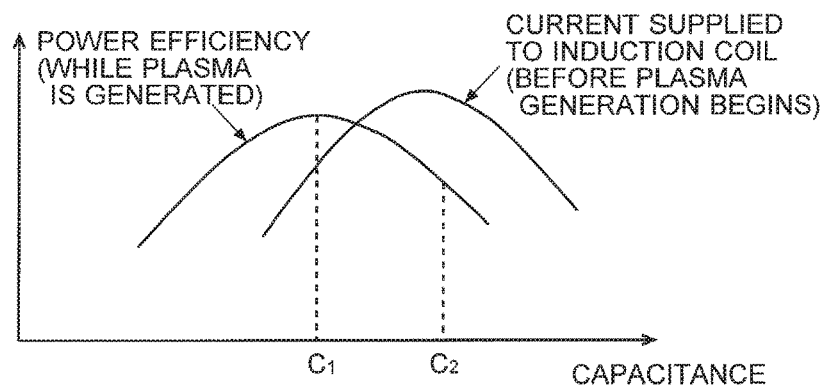
FIG. 4 is a diagram showing the relationship between the circuit constant in the impedance conversion circuit and the power efficiency in the plasma generation process.
Figure 5:
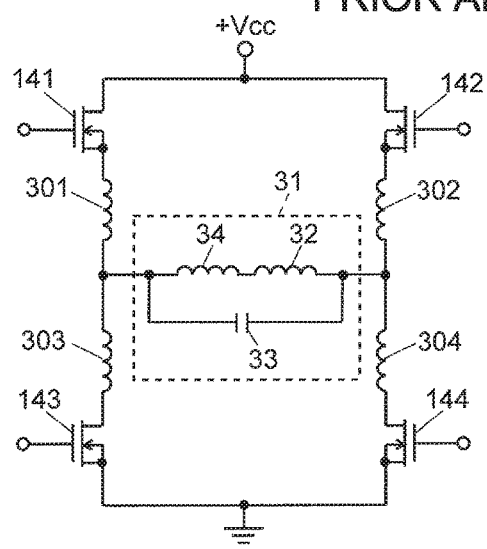
FIG. 5 is a schematic configuration diagram of a conventional radio-frequency power unit employing self-oscillation.

FIG. 4 shows the relationship between the capacitance C of the capacitor 18 and the power efficiency in the steady state of lighting for a certain value of the inductance L of the inductor 17 (e.g. L2 in the previously described example). The power efficiency in the steady state of lighting is maximized when the capacitance C of the capacitor 18 is C1. In general, this state is presumed to be the (optimum) state where the impedance matching is achieved by the impedance conversion effect in the impedance conversion circuit 16. However, when the capacitance C of the capacitor 18 is set at C1, the induction coil may not be supplied with an adequate amount of current for assuredly igniting the plasma. On the other hand, if the capacitance C of the capacitor 8 is set at C2 which is higher than C1, a greater amount of current is supplied to the induction coil 21 in the process of igniting the plasma and the lighting characteristic at the time of the steady state of lighting becomes favorable, although the power efficiency in the plasma generation process decreases.

Taking this into account, the radio-frequency power unit of the present embodiment is configured so that the value of the capacitance C of the capacitor 18 in the impedance conversion circuit 16 is selectable between C1 and C2. Under the command of a controller 24 for controlling the ignition of the plasma, a switching driver 23 changes the capacitance C of the capacitor 18 in the impedance conversion circuit 16. The inductance L of the inductor 17 is fixed; only the capacitance C of the capacitor 18 is varied. This means a change in the impedance conversion factor in the impedance conversion circuit 16. Specifically, the controller 24 performs the following control:

When the plasma needs to be ignited, the controller 24 commands the switching driver 23 to set the capacitance C of the capacitor 18 in the impedance conversion circuit 16 at C2. By this operation, the impedance conversion factor in the impedance conversion circuit 16 is set so that a greater amount of radio-frequency current can be supplied to the LC resonance circuit 19 before the plasma generation begins. As a result, a large amount of radio-frequency current flows through the induction coil 21 in the plasma-igniting phase and a high-energy alternating electromagnetic field is generated in the plasma torch, whereby a strong induction electric field is formed in the plasma-gas atmosphere. Consequently, an ionization of the plasma gas easily occurs and the plasma is ignited in a stable way.

After a predetermined period of time has elapsed from the point where the plasma is ignited, the controller 24 commands the switching driver 23 to switch the capacitance C of the capacitor 18 in the impedance converter 16 from C2 to C1. By this operation, the impedance conversion factor in the impedance conversion circuit 16 is set so that the power efficiency for the steady state of lighting is approximately optimized. As a result, energy is efficiently injected into the plasma, whereby the plasma is maintained in a stable form.

Figure 2:
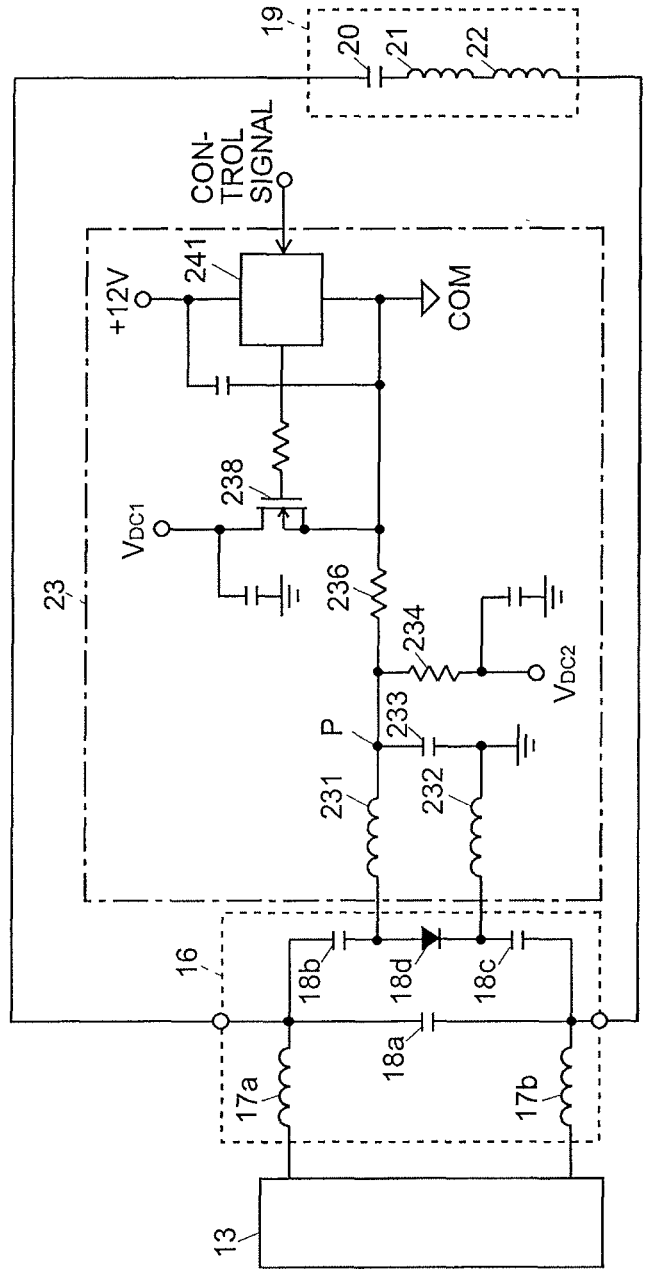
FIG. 2 is a detailed circuit configuration diagram of the impedance conversion circuit in FIG. 1.

FIG. 2 shows one detailed example of the circuit of the impedance conversion circuit 16 and the switching driver 23 in FIG. 1. The inductor 17 in FIG. 1 corresponds to the first and second inductors 17a and 17b in FIG. 2. Similarly, the capacitor 18 in FIG. 1 corresponds to the capacitor 18a and a series-connection circuit connected in parallel with it in FIG. 2, the series-connection circuit consisting of two capacitors 18b, 18c and a PIN diode 18d. The PIN diode 18d functions as the switching element: When the PIN diode 18d is in an effectively ON state, the series-connection circuit including the capacitors 18b and 18c are connected in parallel with the capacitor 18a; when the PIN diode 18d is in an effectively OFF state, the series-connection circuit including the capacitors 18b and 18c does not work and only the capacitor 18a becomes effective as the reactance element.

As is generally known, a PIN diode can be represented as an equivalent circuit including a resistor within a radio-frequency range, and its equivalent resistance changes with a DC bias. This fact is used in the radio-frequency power unit of the present embodiment; i.e. the aforementioned operation of varying the capacitance C of the capacitor 18 is achieved by changing the DC bias applied to the PIN diode 18d.

To put it specifically, as shown in FIG. 2, the switching driver 23 includes: two inductors 231 and 232 which respectively have their first ends connected to the anode and cathode terminals of the PIN diode 18d; a capacitor 233 connected between the second ends of the two inductors 231 and 232; a resistor 234 connected between the second end of the inductor 231 and a negative power-supply voltage $V_{DC2}$; a MOSFET 238 with the source potential floated at the COM potential; a photo coupler 241 which receives control signals from the controller (not shown in FIG. 2) and transmits signals (for turning on and off a MOSFET) to the MOSFET 238; and a resistor 236 connected between the source terminal of the MOSFET 238 and the inductor 231.

When a control signal is fed from the controller to the photo coupler 241, a predetermined voltage (which corresponds to a logical "1" of the two-value logic) is generated from the output terminal of the photo coupler 241, whereby the MOSFET 238 is turned on. In this state, the potential at the connection point of the source terminal of the MOSFET 238 and the resistor 236 is approximately $V_{DC1}$. Therefore, the potential at the connection point P of the inductor 231 and the capacitor 233 is equal to the potential obtained by dividing the potential difference between $V_{DC1}$ (which is positive) and $V_{DC2}$ (which is negative) by the resistors 236 and 234. If the resistance value of the resistor 236 is adequately lower than that of the resistor 234, the potential at the connection point P becomes a forward bias potential for the PIN diode 18d and turns on this diode 18d, whereby the series circuit of the capacitors 18b and 18c is connected in parallel with the capacitor 18a. This causes a relative increase in the capacitance of the capacitor 18 in the impedance conversion circuit 16. This is the situation where the capacitance C of the capacitor 18 is set at C2 in FIG. 4.

When the current supplied from the controller to the photo couplet 241 is blocked, the voltage at the output terminal of the photo coupler 241 decreases to the level which corresponds to a logical "0" of the two-value logic, so that the MOSFET 238 turns off In this state, the resistor 236 can be regarded as virtually absent, and the connection point P of the inductor 231 and the capacitor 233 is connected to the negative $V_{DC2}$ via the resistor 234. Thus, the potential at the connection point P becomes negative, whereby the PIN diode 18d is reverse-biased and turned off. In this state, the series circuit of the capacitors 18b and 18c can be regarded as absent, which results in a relative decrease in the capacitance of the capacitor 18 in the impedance conversion circuit 16. This is the situation where the capacitance C of the capacitor 18 is set at C1 in FIG. 4.

In the previously described manner, the switching driver 23 can vary the capacitance C of the capacitor 18 in the impedance conversion circuit 16 between the two levels. When the capacitance C is varied in this manner by turning the PIN diode 18d on and off, the resistor 234 and the capacitor 233 function as an integration circuit which have some time constant. That is to say, although the potential at the source terminal of the MOSFET 238 suddenly changes according to the ON/OFF operation of the MOSFET 238, the potential at the connection point P of the inductor 231 and the capacitor 233 changes more slowly depending on the time constant of the integration circuit. This results in a slower change in the capacitance C of the capacitor 18, which prevents the phenomenon that the plasma is extinguished due to a sudden (stepwise) change in the impedance conversion factor of the impedance conversion circuit 16.

It should be noted that the previous embodiment is a mere example of the present invention, and any change, modification, addition or the like appropriately made within the spirit of the present invention will naturally fall within the scope of claims of the present application.

For example, the circuit configuration shown in FIGS. 1 and 2 is a mere example. It is commonly known to those skilled in the art that the circuits which can perform the previously described operations are not limited to the examples shown in those drawings. Furthermore, a different configuration of the switching circuit (e.g. a half-bridge drive circuit) may be used in place of the full-bridge drive circuit used as the switching circuit for driving the LC resonance circuit in the previous embodiment.

REFERENCE SIGNS LIST

10 . . . Commercial AC Power Source
11 . . . DC Power Source
12, 18a, 18b, 18c, 20, 233 . . . Capacitor
13 . . . Full-Bridge Drive Circuit
141-144, 238 . . . MOSFET
151-154 . . . MOSFET Drive Circuit
16 . . . Impedance Conversion Circuit
17 . . . First Reactance Element (Inductor)
17a . . First Inductor
17b . . . Second Inductor
18 . . . Second Reactance Element (Capacitor)
18d . . . PIN Diode
19 . . . LC Resonance Circuit
21 . . . Induction Coil
22 . . . Primary Winding
23 . . . Switching Driver
231, 232 . . . Inductor
234, 236 . . . Resistor
241 . . . Photo Coupler
24 . . . Controller

The invention claimed is:
1. An inductively coupled plasma emission spectrometer comprising: a radio-frequency power unit including: a DC voltage source; an LC resonance circuit including an induction coil for plasma generation and a capacitor; and a switching circuit including a semiconductor switching element for switching DC power supplied from the DC voltage source and for supplying the thereby obtained power to the LC resonance circuit, thus supplying radio-frequency power into the induction coil so as to generate plasma, the radio-frequency power unit further including:
  a) an impedance converter arranged between the switching circuit and the LC resonance circuit, the impedance converter switching an impedance conversion factor among a plurality of levels; and
  b) a controller for operating the impedance converter so as to switch the impedance conversion factor from a value set for a period of plasma ignition to a value set for a period with a steady state of lighting after the plasma is ignited so that a current-supplied to the induction coil during the period of plasma ignition is larger than the current supplied to the induction coil during the period with the steady state of lighting;
  wherein the impedance converter includes a first capacitor, a switching element, and a second capacitor which are connected in series, and a third capacitor which forms a parallel connection with the first capacitor, the switching element, and the second capacitor, the switching element disconnecting the first and second capacitors from the parallel connection, wherein the switching element is connected between the first and second capacitor; and further comprises an integration circuit for slowing down, with a time constant, a change of a signal for controlling a switching operation of the switching element; wherein the integration circuit is connected across the switching element.

2. The inductively coupled plasma emission spectrometer according to claim 1, wherein the impedance converter further includes an inductor and allows the impedance conversion factor to be switched by varying a capacitance of the first, second, and third capacitors, respectively.

3. The inductively coupled plasma emission spectrometer according to claim 2, wherein the impedance converter varies the capacitance of the first, second, and third capacitors to have a first value so that a power efficiency is maximized during the period with the steady state of lighting and varies the capacitance of the first, second, and third capacitors to have a second value so that the current supplied to the induction coil increases albeit the power efficiency decreases during the period of plasma ignition.

4. The inductively coupled plasma emission spectrometer according to claim 1,
   wherein the LC resonance circuit further includes a primary winding of a feedback transformer, and
   wherein a secondary winding magnetically coupled with the primary winding is connected to the semiconductor switching element in the switching circuit.

* * * * *